United States Patent [19]

Bottman

[11] Patent Number: 4,628,278
[45] Date of Patent: Dec. 9, 1986

[54] LOW EVEN-ORDER HARMONIC DISTORTION AMPLIFIER AND METHOD

[75] Inventor: Jeffrey S. Bottman, Seattle, Wash.

[73] Assignee: John Fluke Mfg. Co., Inc., Everett, Wash.

[21] Appl. No.: 625,547

[22] Filed: Jun. 28, 1984

[51] Int. Cl.$^4$ .............................................. H03F 1/32
[52] U.S. Cl. .................................... 330/149; 330/144; 330/284; 330/310
[58] Field of Search ............... 330/1 R, 149, 157, 310, 330/144, 145, 284, 293; 328/162; 333/81 R

[56] References Cited

U.S. PATENT DOCUMENTS 3,971,993  7/1976  Constant .......................... 330/149 X

OTHER PUBLICATIONS

Prasad et al., "Low Noise, Low Frequency Amplifier", Electro-Technology, vol. 15, No. 4, Jul.-Aug. 1971, pp. 133-135.

Primary Examiner—James B. Mullins
Attorney, Agent, or Firm—Saidman, Sterne, Kessler & Goldstein

[57] ABSTRACT

An amplifying system and method produces a substantial reduction in the D.C. and even-order harmonics in an output signal by employing a first inverting amplifying stage cascaded with an attenuating stage which is cascaded with a second inverting amplifying stage. The electrical characteristics of each of the two inverting amplifying stages are substantially the same. The gain, in dB, exhibited by each of the amplifying stages is substantially equal to the attenuation loss, in dB, produced by the attenuator stage. Conventional components and fabrication techniques allow substantial attenuation of the D.C. and even-order harmonic components produced by the nonlinearities in the active devices of the amplifiers as compared to a single amplifier case producing the same gain A.

13 Claims, 11 Drawing Figures

LOW EVEN-ORDER HARMONIC DISTORTION AMPLIFIER AND METHOD

BACKGROUND OF THE INVENTION

1. Field of the Invention

The present invention relates generally to amplifying systems and methods, and more particularly, to amplifying systems and methods which reduce significantly even-order harmonic distortion.

2. Description of the Related Art

Active devices used in amplifiers typically exhibit nonlinearities. As is well-known, such nonlinearities produce unwanted components in the signal at the output of the amplifier. This is particularly the case with amplifiers using semiconductor active devices. Such amplifiers typically produce unwanted D.C. and even and odd order harmonics in the output signal.

Representative of conventional amplifying systems is that shown in U.S. Pat. No. 3,399,356 to Davies. The Davies circuit shows a system employing at least two cascaded tuned emitter stages with an attenuator as a coupling circuit between the stages. The Davies circuit teaches the use of tuned emitter amplifier stages; broad band amplifiers are not taught. The stages are inverting. Further, the relative gains of the amplifiers and the attenuator are not discussed. The Davies system does not address reduction of unwanted harmonic components.

Another patent that is representative of conventional amplifiers is U.S. Pat. No. 3,997,852 to Schornack et al. The Schornack patent shows an r.f. wide band amplifier. An input signal is provided to a transformer, whose output is provided to a field effect transistor attenuator. The output of the field effect transistor attenuator is applied to the input of a field effect transistor amplifier, whose output is provided to a transformer. The output of the amplifier system is provided at the output of this second transformer. The Schornack system only employs one amplifier.

The inventor is also aware of the following additional U.S. patents which are representative of conventional amplifier technology: No. 1,646,438 to Affel; No. 2,440,456 to Ferguson; No. 2,617,039 to Young; No. 2,839,619 to Johnstone; No. 2,840,646 to Bell; No. 3,076,133 to Holcomb; No. 3,246,252 to Beyer; No. 3,633,120 to Battjes; No. 3,729,683 to Hemme; No. 3,863,173 to Scheid et al.; No. 4,074,204 to Broburg et al.; No. 4,155,047 to Rubens et al.; No. 4,301,445 to Robinson; No. 4,367,442 to Tanaka et al.; and No. 4,379,995 to Yamada et al.

SUMMARY OF THE INVENTION

The present invention is an amplifier system and method which substantially attenuates the D.C. and even-order harmonics generated in an output signal as compared to a single amplifier of the type used in the present invention. Basically, the present invention comprises a first inverting amplifier stage which receives an input signal and amplifies this input signal substantially by a gain amount $-A$. It should be noted that gains and attenuations are expressed as multiplying factors throughout this discussion, and are expressed in dB only if specifically noted. The first amplifier inverts the input signals as well as amplifies it.

The output of the first amplifier stage is supplied to an attenuator stage. The attenuator attenuates the signal from the first amplifier stage substantially by an attenuation of $1/A$. The attenuator typically exhibits a broad band frequency response characteristic.

The attenuated signal from the attenuating stage is supplied to the input of a second inverting amplifier stage. The second inverting amplifier stage is substantially identical in electrical operation to the first inverting amplifier stage. The second inverting amplifier stage amplifies the attenuated signal substantially by a gain of $-A$.

The output from the second amplifier stage thus has a gain substantially equal to a gain amount of A as compared to the input signal provided to the first amplifier stage, but its D.C. component and its even-order frequency components are substantially attenuated. In this way, two inverting amplifiers can be cascaded with an attenuator stage disposed between them and provide a superior attenuation of the D.C. and even-order components as compared to a single amplifier stage which amplifies an input signal by the same gain amount $-A$.

More specifically, the first and second inverting amplifier stages can comprise amplifiers of identical design. Such amplifiers can utilize semiconductor active devices such as bipolar transistors. Further, any suitable type of amplifier configuration can be used as long as it provides the desired substantially identical electrical performance. Such amplifier stages can be fabricated on a single substrate in the form of a hybrid circuit or the active devices of such amplifier stages can utilize the same substrate. Such an approach results in the amplifiers exhibiting substantially the same electrical characteristics if all external components are properly matched.

The attenuator that is interposed between the first inverter amplifier stage and the second inverter amplifier stage can take any form that will produce the desired attenuation of $1/A$. Representative of such suitable attenuators are resistive elements and power dividers. When a power divider is employed, the excess power produced by such device can be utilized by a utilization device to effect desired functions or controls of other portions of an electronic system. For example, the utilization device can be a detector diode which produces an output signal used to control the level of the output of an instrument which utilizes the output from the second amplifier stage.

Substantial reduction in the D.C. and even-order harmonics can be achieved in practice using conventional parts and fabrication techniques. While the use of such conventional parts and fabrication techniques does not result in the reduction in the D.C. and even-order harmonic components that is predicted theoretically, substantial reduction has been achieved in practice without the requirement of special testing or matching of components. In this way, the present invention has particular applicability for use in the mass production of amplifiers used in, for example, test equipment and the like where criticalness in the operation of an electronic circuit must be minimized in order to achieve reliable performance in the field.

The present invention can operate in any desired frequency range, such as audio frequency or radio frequency. Theoretically, the present invention can be utilized wherever an active device is used in each of the two amplifying stages. It is required that each of the two amplifying stages be inverting and have a gain, in dB, substantially equal to the loss, in dB, exhibited by the attenuation device that is interposed between the two .

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which.

DETAILED DESCRIPTION OF THE PREFERRED EMBODIMENT

A. Introduction

The full dimensions of the present invention can be appreciated by reviewing the theory of operation of related circuit topologies. This review is presented below using mathematical models of such related circuit topologies.

Before reviewing the related circuit topologies, it may be useful to understand the present invention in broad terms. In summary, the present invention comprises a first amplifier exhibiting substantially a gain of $-A$. The amplifier is of the inverting type. An input signal is amplified by the first amplifier and provided at its output. The signal at the output of the first amplifier is supplied to an attenuator. The attenuator exhibits an attenuation substantially of $1/A$. The attenuated output of the attenuator—which has a level substantially equal to the input level of the first amplifier—is applied to the input of a second amplifier. The second amplifier inverts the attenuated output and amplifies it by a gain substantially equal to $-A$. Like the first amplifier, the second amplifier is of the inverting type. The output signal from the second amplifier has a level substantially equal to the level of the input signal applied to the first amplifier increased by a gain A. While one would expect at best no increase, and at worst an increase, in the distortion components present in the output of the first amplifier, the inventor has found unexpectedly that this is not the case. Instead, substantial attenuation of the D.C. and even-order harmonics is present in the output of the second amplifier as compared to the levels of such components in the output of a single amplifier of gain $-A$. In this way, the present invention using standard active devices in standard amplifier circuits can produce an amplified output signal having a substantial reduction in the D.C. and even-order harmonics.

Figure 1:
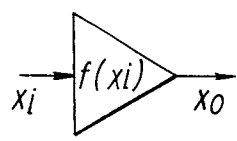
FIG. 1 is a block diagram of the mathematical representation of the single amplifier case.

Turning now to related circuit topologies, reference is now made to FIG. 1. FIG. 1 shows a block diagram representative of a mathematical model of a single amplifier. For purposes of discussion, this shall be called the single amplifier case. Several assumptions have been made concerning the single amplifier case. First, it is assumed that the amplifier exhibits amplitude distortion, which results in a nonlinear transfer characteristic. Second, it is assumed that the amplifier is memoryless. This means that the output of the amplifier is an instantaneous function of the input. In other words, frequency response effects are not considered in the mathematical model. Third, it is assumed that the nonlinearity exhibited by the amplifier is weak.

As an aside, it is well-known that the operation of an amplifier can be modeled mathematically by a power series of the input signal. A suitable reference source which sets forth such mathematical modeling is *Solid State Microwave Amplifier Design* by Tri T. Ha, published in 1981 by John Wiley & Sons, which text is incorporated by reference herein.

Equation I shown below is the transfer function of the single amplifier case where the nonlinearity is weak, as shown by equation II, for the range of the input signal $x_i$ of interest:

$$f(x_i) = a_1 x_i + a_2 x_i^2 + a_3 x_i^3 = x_o \quad (I)$$

where:
the linear term $= a_1 x_i$
the second harmonic term $= a_2 x_i^2$
the third harmonic term $= a_3 x_i^3$ $$|a_1 x_i| >> |a_2 x_i^2 + a_3 x_i^3| \quad (II)$$

Note that the transfer function shown in equation I only includes the linear term, the second harmonic term and the third harmonic term. This is due to the fact that the nonlinearity is weak, as shown in equation II. In other words, the fourth and higher order terms can be ignored for purposes of this analysis since they are of such low value.

When a sine wave input signal of equation III below is applied to the input of the single amplifier case, it produces the output signal shown in equation IV, which has been rewritten in equation V for purposes of simplification:

$$x_i = V_o \cos \omega t \quad (III)$$

$$X_o = a_1 V_o \cos\omega t + a_2 V_o^2 \cos^2\omega t + a_3 V_o^3 \cos^3\omega t \quad (IV)$$

$$= \tfrac{1}{2} a_2 V_o^2 + [a_1 V_o + \tfrac{3}{4} a_3 V_o^3] \cos\omega t +$$

-continued $$[\tfrac{1}{2}\alpha_2 V_o^2]\cos 2\omega t + [\tfrac{1}{4}\alpha_3 V_o^3]\cos 3\omega t$$

$$X_o = \beta_0 + \beta_1 \cos wt + \beta_2 \cos 2wt + \beta_3 \cos 3wt \quad \text{(V)}$$

where $\beta$ coefficients are in terms of $\alpha$ coefficients and the input signal amplitude $V_o$, as follows:

$$\beta_0 = \tfrac{1}{2}\alpha_2 V_o^2$$

$$\beta_1 = \alpha_1 V_o + \tfrac{3}{4}\alpha_3 V_o^3$$

$$\beta_2 = \tfrac{1}{2}\alpha_2 V_o^2$$

$$\beta_3 = \tfrac{1}{4}\alpha_3 V_o^3$$

Note that the output signal in the single amplifier case contains the fundamental frequency as well as D.C., second and third harmonic components. Also note that the D.C., second and third harmonic components can be of significant value relative to the fundamental frequency components if the $\alpha_2$ and $\alpha_3$ values are significant.

Figure 2:
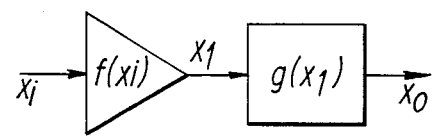
FIG. 2 is a block diagram of the mathematical representation of the first amplifier followed by an attenuator case.

Next, the single amplifier followed by an attenuator case is examined. Referring now to FIG. 2, a block diagram of the mathematical model used to represent an attenuator connected to the output of the single amplifier is shown. The amplifier is the same as the amplifier of the single amplifier case. Thus, the equations used for the single amplifier case apply with respect to the amplifier of the single amplifier followed by an attenuator case. The attenuator exhibits the transfer function shown below an equation VI:

$$g(x) = (1/A)x \quad \text{(VI)}$$

where: $1/A$ = attenuation factor

Equation VII below shows the transfer function of the single amplifier followed by an attenuator case:

$$x_o = (1/A)f(x_i) = (1/A)[\alpha_1 x_i + \alpha_2 x_i^2 + \alpha_3 x_i^3] \quad \text{(VII)}$$

The output $x_o$ provided by the attenuator is shown below by equation VIII where the input signal is the sine wave of equation III and the $\beta$'s are those of equation V:

$$x_o = (1/A)[\beta_0 + \beta_1 \cos \omega t + \beta_2 \cos \omega t + \beta_3 \cos 3\omega t] \quad \text{(VIII)}$$

Equation VIII shows that the ratio of the D.C., second and third harmonics to the fundamental is the same as the present in the single amplifier case, except that all are equally attenuated by an amount equal to the value of attenuation $1/A$. Conceptually, this makes sense since the attenuation is assumed to be frequency independent. In other words, an equal amount of attenuation of the D.C., fundamental, second and third harmonics occurs.

Figure 3:
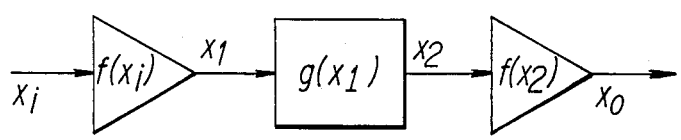
FIG. 3 is a block diagram of the mathematical representation of the noninverting amplifier followed by an attenuator followed by a noninverting amplifier case.

Referring now to FIG. 3, the case of an amplifier followed by an attenuator followed by an identical amplifier is shown in block form, which represents the mathematical model of such case. It is assumed that the two amplifiers are substantially the same and are like the amplifier in the single amplifier case and the single amplifier followed by an attenuator case discussed above.

The input of the second amplifier, which is the output of the attenuator, is shown below by equation IX. Note that equation IX is the same as equation VII discussed above for the amplifier followed by an attenuator case:

$$x_2 = (1/A)[\alpha_1 x_i + \alpha_2 x_i^2 + \alpha_3 x_i^3] \quad \text{(IX)}$$

Equation X shown below is the transfer function for the output of the second amplifier. It is obtained by substituting equation IX into equation I discussed above:

$$X_o = f(X_2) = \alpha_1 \left[ \frac{1}{A}(\alpha_1 X_i + \alpha_2 X_i^2 + \alpha_3 X_i^3) \right] + \alpha_2 \left[ \frac{1}{A^2}(\alpha_1 X_i + \alpha_2 X_i^2 + \alpha_3 X_i^3)^2 \right] + \alpha_3 \left[ \frac{1}{A^3}(\alpha_1 X_i + \alpha_2 X_i^2 + \alpha_3 X_i^3)^3 \right] \quad \text{(X)}$$

An approximation is now made to simplify the analysis. Specifically, as shown in equation II above, the nonlinear terms are substantially less than the linear term for the range of interest of $x_i$. Since this is the case, an approximation expression for $x_o$ of equation X can be rewritten and retains the dominant terms. This equation is shown below as equation XI:

$$x_o \approx \alpha_1[(1/A)(\alpha_1 x_i + \alpha_2 x_i^2 + \alpha_3 x_i^3)] + \alpha_2[(1/A^2)(\alpha_1 x_i)^2] + \alpha_3[(1/A^3)(\alpha_1 x_i)^3] \quad \text{(XI)}$$

Equation XI is rewritten as a power series in equation XII as follows:

$$x_o \approx (\alpha_1^2/A)x_i + \alpha_2[(\alpha_1/A) + (\alpha_1/A)^2]x_i^2 + \alpha_3[(\alpha_1/A) + (\alpha_1/A)^3]x_i^3 \quad \text{(XII)}$$

Now, applying a sine wave term in the form of equation III above into equation XII produces the approximation of the output signal shown below in equation XIII:

$$x_o \approx (\alpha_1^2/A)V_o \cos \omega t + \alpha_2[(\alpha_1/A) + (\alpha_1/A)^2]V_o^2 \cos^2 \omega t + \alpha_3[(\alpha_1/A) + (\alpha_1/A)^3]V_o^3 \cos^3 \omega t \quad \text{(XIII)}$$

Equation XIII can be rewritten as equation XIV shown below, which is in the form of a sum of harmonic components as follows:

$$X_o = \gamma_0 + \gamma_1 \cos \omega t + \gamma_2 \cos 2\omega t + \gamma_3 \cos 3\omega t \quad \text{(XIV)}$$

$\gamma$ coefficients are expressed in terms of $\alpha$ coefficients of equation I and the input signal amplitude $V_o$ as follows:

$$\gamma_0 = \tfrac{1}{2}\alpha_2[(\alpha_1/A) + (\alpha_1/A)^2]V_o^2$$

$$\gamma_1 = (\alpha_1^2/A)V_o + \tfrac{3}{4}\alpha_3[(\alpha_1/A) + (\alpha_1/A)^3]V_o^3$$

$$\gamma_2 = \tfrac{1}{2}\alpha_2[(\alpha_1/A) + (\alpha_1/A)^2]V_o^2$$

$$\gamma_3 = \tfrac{1}{4}\alpha_3[(\alpha_1/A) + (\alpha_1/A)^3]V_o^3$$

Equation XIV shows that the output signal from the second amplifier includes a D.C. component, a second harmonic component, and a third harmonic component in addition to the desired fundamental signal. Equation XIV also shows that these undesired components may be of significant value if the coefficients that multiply them have a significant value, which often is the case.

Assume now, for purposes of analysis, that the noninverting amplifiers have equal gain and that the gain of each, in dB, is equal to the attenuator's attenuation, in dB. In other words, assume in this special case, that $\alpha_1 = A$. Substituting A into equation XIV produces the following $\gamma$ coefficients shown below as equation XV:

when: $\alpha_1 = A$
thus:

$$\gamma_0 = \tfrac{1}{2}\alpha_2[1+1]V_o^2 = \alpha_2 V_o^2 = 2\beta_o$$

$$\gamma_1 = \alpha_1 V_o + (3/2)\alpha_3 V_o^3 = \beta_1 + \tfrac{3}{2}\alpha_3 V_o^3 \approx \beta_1$$

$$\gamma_2 = \tfrac{1}{2}\alpha_2[1+1]V_o^2 = \alpha_2 V_o^2 = 2\beta_2$$

$$\gamma_3 = \tfrac{1}{2}\alpha_3[1+1]V_o^3 = \tfrac{1}{2}\alpha_3 V_o^3 = 2\beta_3 \quad \text{(XV)}$$

Substituting the $\gamma$ terms of equation XV into equation XIV produces equation XVI shown below. Equation XVI thus shows the output signal $x_o$ produced by the second amplifier in the amplifier followed by attenuator followed by an amplifier case where the amplification gain of each amplifier equals A and the attenuation factor produced by the attenuator equals 1/A. Compare this with equation V (which is reproduced below for convenience purposes), which shows the output signal provided by the single amplifier case.

$$x_o = \beta_0 + \beta_1 \cos \omega t + \beta_2 \cos 2\omega t + \beta_3 \cos 3\omega t \quad \text{(V)}$$

$$x_o = 2\beta_0 + \beta_1 \cos \omega t + 2\beta_2 \cos 2\omega t + 2\beta_3 \cos 3\omega t \quad \text{(XVI)}$$

It is thus seen that in this special case of the amplifier followed by an attenuator followed by an amplifier situation that the output signal has been degraded, in that its D.C. component, second harmonic component and third harmonic components are twice what they would be if only a single amplifier case had been used. This makes sense since the nonlinear components produced by each amplifier are doubled when two amplifiers are cascaded. Obviously, the attenuator eliminates the gain produced by one of the single amplifiers since it has an attenuation equal to 1/A, which is the reciprocal of the gain of a single amplifier.

B. Theory of the Present Invention

Figure 4:
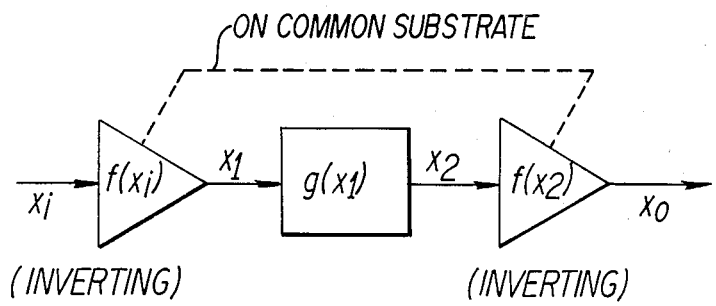
FIG. 4 is a block diagram of the mathematical representation of the present invention comprising an inverting amplifier following by an attenuator followed by an inverting amplifier.

The present invention comprises in its basic form an inverting amplifier followed by an attenuator followed by an inverting amplifier, which is shown in block diagram form in FIG. 4. When the amplifiers are made substantially the same and the gain of each is equal to approximately $-A$ and the attenuation exhibited by the attenuator is equal to 1/A, the inventor has discovered that a substantial reduction in the D.C. and even-order harmonics occurs in the output signal. This is very surprising when you compare this result with that produced by the special case of the noninverting amplifier followed by an attenuator followed by a noninverting amplifier presented above in equation XVI. The mathematical analysis presented below shows why the results obtained with the present invention occur; following this technical explanation is a representative example of the present invention which shows actual test results that confirm this theoretical analysis.

Equation XVII below shows the results of substituting into equation XIV the assumptions that $\alpha_1$ equals $-A$:

$$\alpha_1 = -A$$

thus:

$$\gamma_0 = \tfrac{1}{2}\alpha_2[-1 + (-1)^2]V_0^2 = 0 \quad \text{(XVII)}$$

$$\gamma_1 = -\alpha_1 V_0 + \tfrac{3}{4}\alpha_3[(-1) + (-1)^3]V_0^3$$

$$= -\alpha_1 V_0 - \tfrac{3}{2}\alpha_3 V_0^3 \approx -\beta_1$$

$$\gamma_2 = \tfrac{1}{2}\alpha_2[-1 + (-1)^2]V_0^2 = 0$$

$$\gamma_3 = \tfrac{1}{4}\alpha_3[(-1) + (-1)^3]V_0^3 = -\tfrac{1}{2}\alpha_3 V_0^3$$

$$= -2\beta_3$$

Substituting the values obtained for equation XVII into equation XIV (presented above) produces equation XVIII shown below, which represents the output $x_o$ of the second inverting amplifier as provided by the present invention. Equation XVII is compared with equation V (which is the equation for the single amplifier case; it is repeated below for purposes of comparison), and shows that the D.C. and second harmonic are cancelled out by the present invention and that the third harmonic is twice the level that the third harmonic is in the single amplifier case:

$$x_o = \beta_0 + \beta_1 \cos \omega t + \beta_2 \cos 2\omega t + \beta_3 \cos 3\omega t \quad \text{(V)}$$

$$x_o = -\beta_1 \cos \omega t - 2\beta_3 \cos 3\omega t \quad \text{(XVIII)}$$

Note that the cancellation of the D.C. and the second harmonic component occurs only if the relationship presented below as equation XIX occurs:

$$(\alpha_1/A) + (\alpha_1/A)^2 = 0 \quad \text{(XIX)}$$

Thus, the present invention requires that $\alpha_1 = -A$. To reiterate, this means that the amplifiers of the present invention must: (1) each have gain (in dB) equal to the attenuator's loss (in dB); (2) each be substantially identical; and (3) each be inverting. All three of these conditions must be met in order for the present invention to provide the low level D.C. and even-order harmonic distortion characteristic.

Equation XX is the end result of a more general analysis, where the amplifier's transfer characeristic is assumed to be:

$$f(x) = \alpha_1 x + \alpha_2 x^2 + \alpha_3 x^3 + \alpha_4 x^4 + \ldots$$

Note that as is the case with equation XVIII above, that while the even-order harmonics are suppressed, the present invention produces odd order harmonics that are twice the level of the single amplifier case:

$$x_o = AV_o \cos \omega t - 2(\beta_1 \cos \omega t + \beta_3 \cos 3\omega t + \beta_5 \cos 5\omega t \ldots) \quad \text{(XX)}$$

In summary, the present invention produces a substantial reduction in the D.C. and the even-order harmonics as compared to the output of a single amplifier producing the same amount of gain. In contrast, the present invention increases by 6 dB the level of the odd order harmonics that are present in its output signal. Thus, the present invention has particular application in situations where it is desired to substantially reduce the D.C. and even-order harmonics (particularly the second order harmonic) present in an output signal. It can be appreciated that the present invention does not require the use of precision inverting amplifiers or a precision attenuator to achieve the desired results, as is exhibited below in the representative example of the present invention which is now discussed.

C. Representative Circuit and Performance Results

Figure 5:
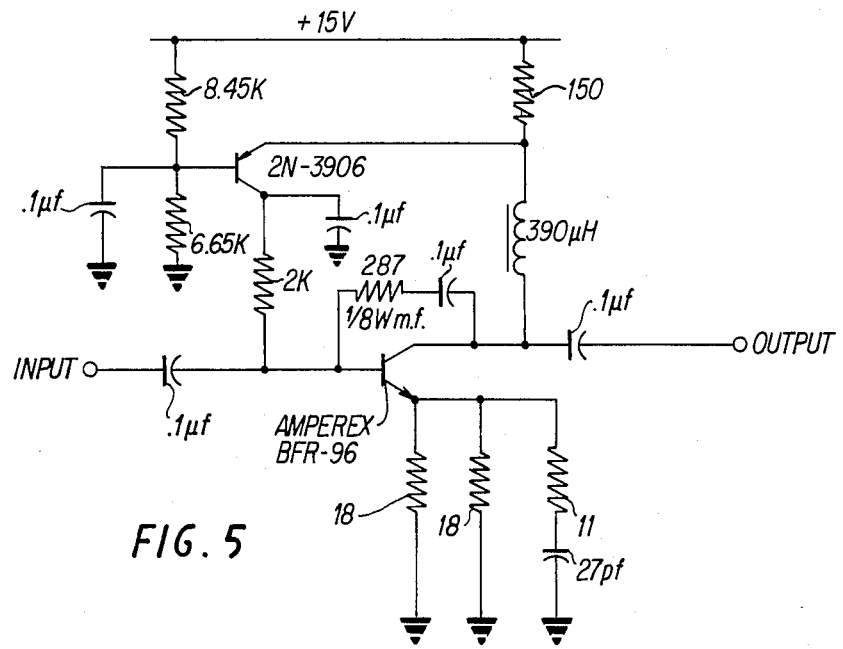
FIG. 5 is a schematic diagram of a representative inverting semiconductor amplifier which can be utilized for each of the two inverting amplifying stage of the present invention.

FIG. 5 shows a schematic of a suitable amplifier that can be employed for each of the two inverting amplifier stages of the present invention. It should be understood clearly, however, that the amplifier shown in FIG. 5 is for purposes of illustration only; any type of amplifier can be employed that meets the three criteria set forth above in order to produce the desired suppression of the the D.C. and even-order harmonics produced by the present invention.

The amplifier shown in FIG. 5 includes representative parts values; it produces a 12 dB gain from 0.1 MHz to 250 MHz. Input and output impedances are nominally 50 ohms. The amplifier is a common-emitter type, with base-collector feedback and emitter degeneration.

Figure 6:
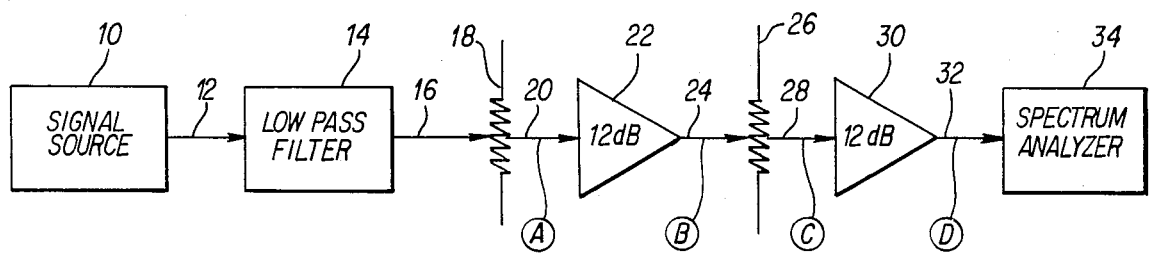
FIG. 6 is a block diagram of a test set-up utilized to produce experimental data showing the operation of the present invention.

FIG. 6 shows a test set-up in block diagram form which is used to provide the experimental verification presented below showing the even-order harmonic cancellation produced by the present invention. A signal source 10 is used to generate a test signal. A suitable form for signal source 10 is a Fluke Model 6071A, manufactured by the assignee. The output of signal source 10 is provided via a coaxial line 12 to the input of a low pass filter 14 of conventional design. Low pass filter 14 has a predetermined cutoff frequency. In the present situation, where the signal on line 12 has a frequency of 30 MHz, low pass filter 14 can be made to have a cutoff substantially equal to the frequency of the input signal on line 12 (i.e., 30 MHz).

The output from the low pass filter stage 14 is provided via a coaxial line 16 to an attenuator 18. Any type of attenuator can be employed. Note that there is no requirement that attenuator 18 be used. It was employed in the test set-up in order to control the output of the signal on line 16. A suitable example for attenuator 18 is a −3 dB resistive attenuator such as a Narda Model 4781-3. The Narda Microwave Corporation is located in Plainview, N.Y.

The output from attenuator 18 is provided via a coaxial line 20 to the first inverting amplifier 22. As stated above, amplifier 22 can be of any suitable type. In the test set-up, amplifier 22 was of the type shown in FIG. 5 above, and exhibited a 12 dB gain over the bandwidth set forth above. Note that reference A represents the test point at which the first spectrum analyzer plot (FIG. 7 discussed below) was obtained.

The output of the first amplifier 22 is provided via a coaxial line 24 to the input of an attenuator 26. Attenuator 26 can be of any suitable type which provides the desired attenuation (in this case, 12 dB). A resistive attenuator can be employed, as can a power divider. All that is required is that the attenuation of a desired value is produced in the frequency band of interest. As shown with respect to FIG. 11 below, the excess power produced by a power divider (as compared to a resistive divider which dissipates the excess power through heat dissipation) can be employed to control any type of utilization device or circuit function that is desired.

Reference B represents the test point at which the second spectrum analyzer plot (FIG. 8) is taken. Similarly, reference C represents the test point at which the third spectrum analyzer plot was taken (FIG. 9). A suitable example for attenuator 26 is a variable attenuator Model 907A-2011 made by Weinschel Engineering. Weinschel is located in Gaithersburg, Md. The attenuator is set for −12 dB attenuation.

The output of the attenuator 26 on a coaxial line 28 is applied to a input of a second inverting amplifier 30. Second inverting amplifier 30 is identical to first inverting amplifier 22. In the test set-up, amplifier 30 thus was of the form of the amplifier shown in FIG. 5 above, and produced a 12 dB gain. The output of second amplifier 30 on a coaxial line 32 is applied to the input of a spectrum analyzer 34. Test point D is where the fourth spectrum analyzer plot (FIG. 10 below) was taken. A suitable form for spectrum analyzer 34 is a Hewlett Packard Model 8568A. Hewlett Packard is located in Palo Alto, Calif.

Referring now to FIGS. 7-10, the test results of the test set-up shown in FIG. 6 are shown, where the input signal to the first amplifier is 6.0 dBm at 30 MHz.

Figure 7:
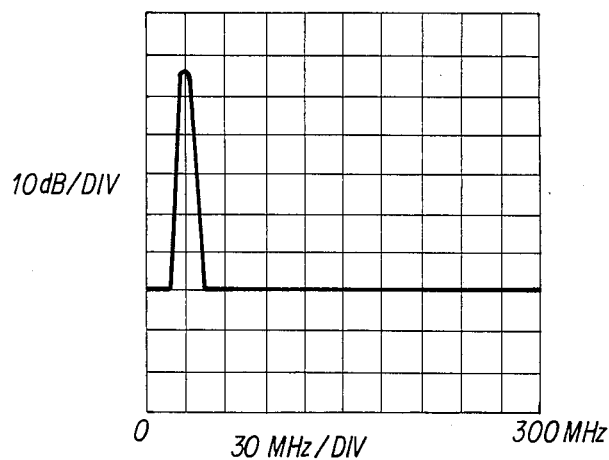
FIG. 7 is a graph plotting the signal present at point A of the block diagram of FIG. 6, where the horizontal axis represents frequency in MHz and the vertical axis represents amplitude in dB.

Referring first to FIG. 7, this plots the spectrum of the signal provided to the input of first inverting amplifier 22. The vertical axis plots frequency, where every division equals 30 MHz, and the horizontal axis plots amplitude, where each division equals 10 dB. It is seen that the only signal of substantial amplitude applied to the input of the first amplifier 22 is the fundamental signal (at 30 MHz) and that all harmonics as well as the D.C. component are less than −56 dBc.

Figure 8:
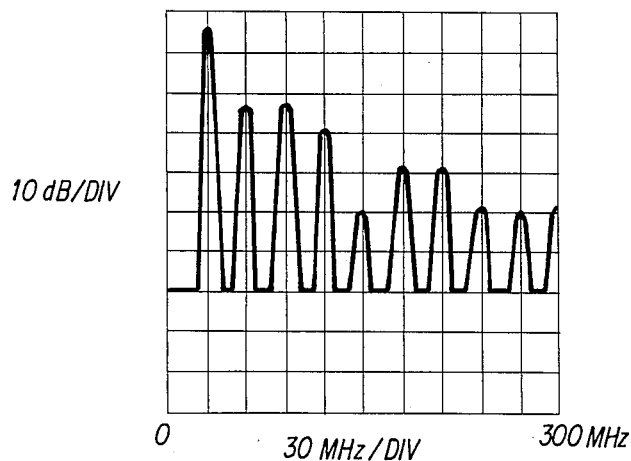
FIG. 8 is a graph plotting the signal present at test point B of FIG. 6, where the vertical and horizontal axes are the same as in FIG. 7.
Figure 9:
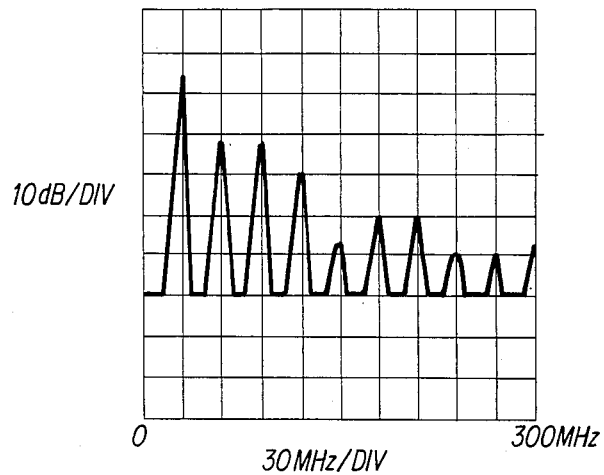
FIG. 9 is a graph of the plot of the signal present at test point C of FIG. 6, where the vertical and horizontal axes are the same as those of FIG. 7.

Referring now to FIG. 8, it is seen that the output signal form the first inverting amplifier 22 comprises the fundamental signal (at 30 MHz), as well as even and odd order harmonies. (Note that the amplifier of FIG. 5 is A.C. coupled and generates no D.C. output component. If the amplifier were D.C. coupled, a D.C. component would exist at the output of the first amplifier but would be largely suppressed at the output of the second.) This is due to the nonlinearities exhibited by the active bipolar semiconductor devices in the amplifier. The spectrum analyzer was set to plot harmonics up to 300 MHz. Obviously, the analyzer could have looked at harmonics having higher frequencies, but it was deemed not to be necessary in order to illustrate the operation of the present invention. Further, note that the bandwidth of the amplifier shown in FIG. 5 above is 0.1 MHz to 250 MHz. As discussed below, it will become apparent that the bandwidth of the amplifier will have a certain effect on the test results obtained with respect to the higher order harmonics.

FIG. 8 shows that the output from the first inverting amplifier 22 has even and odd-order harmonics that are of significant amplitude when compared to the 30 MHz fundamental signal. Specifically, note that the levels of the second and third order harmonics are −20 dBc as compared to the 30 MHz fundamental signal.

FIG. 9 plots the output of the attenuator 18, where the same horizontal and vertical axes of FIGS. 7 and 8 are used. Note that the level of the 30 MHz signal has been attenuated by approximately 12 dB as has the level of the even and odd harmonics. This result agrees with the theoretical results presented above since the attenuator is attenuating equally all of the components present at the output of the first amplifier 22. Thus, it is seen that the fundamental and the even and odd order harmonics present on line 20 have been attenuated by an equal amount by attenuator 26.

Figure 10:
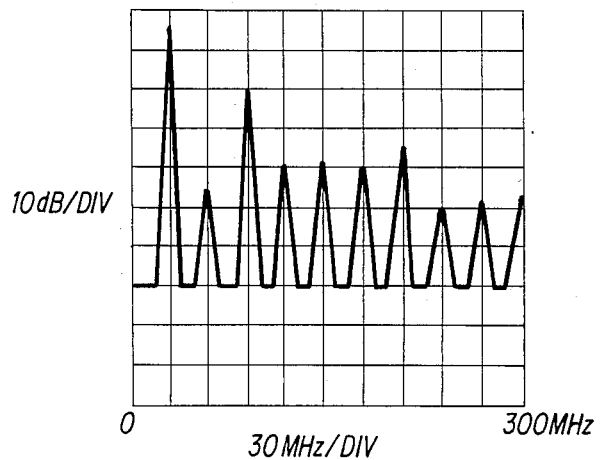
FIG. 10 is a plot of the output present at test point D of FIG. 6, where the vertical and horizontal axes are the same as those axes of FIG. 7.

FIG. 10 plots the spectrum of the signals provided at the output of the second inverting amplifier 30. Again, the horizontal and vertical axes are the same as those of FIGS. 7-9. FIG. 10 dramatically shows the reduction in the even-order harmonics produced by the present invention. Specifically, it is seen that the second order harmonic component is −41 dB below that of the fundamental output signal. It also shows that the fourth harmonic is −38 dB below that of the fundamental output signal. In contrast, the third harmonic signal is −16 dB below the fundamental output signal.

These test results corroborate the theoretical analysis presented above in subsection B. It should be understood that the values for the fifth through tenth harmonics are somewhat different from that predicted by the theoretical analysis due to the bandwidth of each of the inverting amplifiers of the test set-up. However, these higher order harmonics can be eliminated using low pass filters so as not to be of any significant amplitude in the output of the second inverting amplifier 30.

FIG. 10 graphically illustrates the improvement in the reduction of the second and fourth harmonic components produced by the present invention. It graphically corroborates the theoretical analysis presented above. Note that the third order harmonic has been increased by 4 dB, which is 2 dB less than the theory predicts. The fifth and higher order harmonics, as stated above, are not in substantial agreement with the theoretical results due to limitations in the actual circuitry that is employed to produce these test results. (The amplifiers used in the test set-up, while having a bandwidth of 0.1 MHz to 250 MHz, did not exhibit such a response in actual practice.) It should be understood, however, that these higher order harmonic components can be attenuated significantly through the use of low pass filters and other suitable types of harmonic removal techniques, and are often of negligible amplitude compared to the 2nd and 3rd harmonies.

Figure 11:
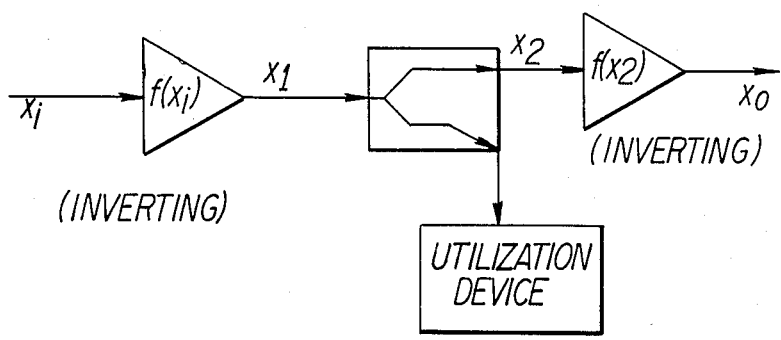
FIG. 11 is a block diagram of the present invention showing the addition of a utilization device coupled to the output of the signal splitter.

FIG. 11 shows in block diagram form the present invention where a power divider has been substituted for a resistive attenuator. Note that the output from the power divider can be utilized by any type of utilization device. For example, this signal from the power divider, which is not needed by the present invention, can be utilized to control other circuit functions, such as a level control in a frequency synthesizer. In this way, this signal can also be used to perform other functions associated with other circuits with which the present invention can be used.

It is also noted that the two inverting amplifiers can be fabricated to use the same substrate. When the active devices of such amplifiers use the same substrates, their characteristics can be made to track so that the amplifiers exhibit substantially identical operation. Other techniques can be used to obtain the desired identical operation of the two inverting amplifiers.

The present invention can be used in any desired frequency range. It is particularly useful in the radio frequency (R.F.) and audio frequency (A.F.) ranges.

While the present invention produces the desired attenuation of even-order harmonics when the gain, in dB, of each of the two inverting amplifier stages is equal to the attenuation loss, in dB, of the attenuator, it should be understood that the present invention is not limited to such equality of gain values. Rather, it encompasses situations where the gain values are different, albeit less reduction in the D.C. and even-order harmonics occurs.

From the foregoing description, one skilled in the art can easily ascertain the essential characteristics of this invention, and without departing from the spirit and scope thereof, can make various changes and modifications of the invention to adapt it to various usages and conditions.

I claim:

1. Apparatus for amplifying an input signal which comprises:
   (a) first inverting amplifier means exhibiting a non-linear amplifying characteristic having an input adapted to be coupled to the input signal for providing a first signal at a first output which is based on the input signal amplified by a first gain;
   (b) attenuator means having an input coupled to said first output for providing a second signal at a second output which is based on said first signal attenuated by an attenuation factor substantially equal to said first gain; and
   (c) second inverting amplifier means exhibiting a non-linear amplifying characteristic substantially similar to that exhibited by said first inverting amplifier means having an input coupled to said second output for providing an output signal at a third output which is based on said second signal amplified by a second gain substantially equal to said first gain.

2. The apparatus as defined in claim 1, wherein said first inverting amplifier means is substantially identical in operation to said second inverting amplifier means.

3. The apparatus as defined in claim 1, wherein the frequency response of said first inverting amplifier means is substantially identical to the frequency response of said second inverting amplifier means.

4. The apparatus as defined in claim 1, wherein said first inverting amplifier means includes a first active device exhibiting said nonlinear amplifying characteristic.

5. The apparatus as defined in claim 1, wherein said second inverting amplifier means includes a second active device exhibiting said nonlinear amplifying characteristic.

6. The apparatus as defined in claim 1, wherein said attenuator means comprises a resistive element.

7. The apparatus as defined in claim 1, wherein said attenuator means comprises a power divider.

8. The apparatus as defined in claim 1, wherein said first inverting amplifier means and said second inverting amplifier means are fabricated using a portion of the same semiconductor substrate.

9. An amplifier for amplifying an input signal comprising:
   (a) first inverting amplifier means having a non-linear amplifying characteristic, adapted to receive the input signal, for producing a first signal by amplifying the input signal by a first gain amount in dB;
   (b) attenuator means, connected to said first amplifier means, for providing a second signal by attenuating said first signal by an attenuation factor in dB; and
   (c) second inverting amplifier means exhibiting a non-linear amplifying characteristic substantially similar to that exhibited by said first inverting amplifier means, connected to said attenuator means, for producing an output signal by amplifying said second signal by a second gain amount in dB, and wherein said first and second gain amounts and said attenuation factor are all substantially equal.

10. The amplifier as recited in claim 9, wherein said first inverting amplifier means operates in the radio frequency range, and wherein said second inverting amplifier means operates in the radio frequency range.

11. The amplifier as recited in claim 9, further comprising a utilization means connected to said attenuating means to provide a function in accordance with said second signal.

12. An amplifier system for substantially attenuating even-order harmonics comprising:
   first inverting amplifier means having a first active device exhibiting non-linearities for producing a first signal by amplifying an input signal by a gain $-A$;
   attenuating means responsive to said first inverting amplifier means for supplying an attenuated signal by attenuating said first signal by said attentuation $1/A$; and
   second inverting amplifier means having a second active device exhibiting substantially similar non-linearities as said first device for producing an output signal by amplifying said attenuated signal by said gain $-A$.

13. An amplifying method for substantially attenuating even-order harmonics, which comprises the steps of:
   (a) amplifying and inverting an input signal in a non-linear amplifier by a gain substantially equal to $-A$ to produce a first signal;
   (b) attenuating said first signal by an attenuation substantially equal to $1/A$ to produce a second signal; and
   (c) amplifying and inverting said second signal in a non-linear amplifier similar to said first non-linear amplifier by a gain substantially equal to $-A$ to produce an output signal.

* * * * *